(12) United States Patent
Wang et al.

(10) Patent No.: US 7,615,426 B2
(45) Date of Patent: Nov. 10, 2009

(54) PMOS TRANSISTOR WITH DISCONTINUOUS CESL AND METHOD OF FABRICATION

(75) Inventors: Chih-Hao Wang, Hsin-Chu (TW); Yen-Ping Wang, Taipei (TW); Pang-Yen Tsai, Jhu-bei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 402 days.

(21) Appl. No.: 11/118,730

(22) Filed: Apr. 29, 2005

(65) Prior Publication Data

US 2006/0189053 A1    Aug. 24, 2006

Related U.S. Application Data

(60) Provisional application No. 60/655,142, filed on Feb. 22, 2005.

(51) Int. Cl.
*H01L 21/336* (2006.01)
*H01L 21/8234* (2006.01)
*H01L 29/76* (2006.01)
*H01L 29/94* (2006.01)
*H01L 27/01* (2006.01)

(52) U.S. Cl. ............. 438/197; 257/347; 257/344; 257/336

(58) Field of Classification Search ........... 438/197; 257/366, 336, 345, 344, 371, 365, 347, 369, 257/350, 351, 370, 900, 384

See application file for complete search history.

(56) References Cited

U.S. PATENT DOCUMENTS

| | | | | | |
|---|---|---|---|---|---|
| 5,739,573 | A | * | 4/1998 | Kawaguchi | 257/384 |
| 5,757,045 | A | * | 5/1998 | Tsai et al. | 257/336 |
| 6,004,861 | A | * | 12/1999 | Gardner et al. | 438/414 |
| 6,096,591 | A | * | 8/2000 | Gardner et al. | 438/238 |
| 6,346,468 | B1 | * | 2/2002 | Pradeep et al. | 438/595 |
| 6,864,126 | B2 | * | 3/2005 | Kim | 438/142 |

(Continued)

FOREIGN PATENT DOCUMENTS

TW    594976    6/2004

OTHER PUBLICATIONS

Kumagai, Y., et al., "Evaluation of Change in Drain Current Due to Strain in 0.13-μm-node MOSFETs," Extended Abstracts of the 2002 International Conference on Solid State Devices and Materials, Nagoya, 2002, pp. 14-15.

*Primary Examiner*—Chuong A. Luu
(74) *Attorney, Agent, or Firm*—Slater & Matsil, L.L.P.

(57) ABSTRACT

A transistor having a discontinuous contact etch stop layer comprising: a substrate having a surface, a gate dielectric on said surface of said substrate, a gate electrode on said gate dielectric, a spacer along a sidewall of said gate dielectric and gate electrode, a source and a drain formed on opposite sides, respectively, of said gate dielectric and said gate electrode, the source and drain defining a channel region having a channel length extending substantially from said source to said drain, in the substrate therebetween, and a contact etch stop layer on said gate and said spacers, and said source and drain. The contact etch stop layer is substantially locally continuous in a direction perpendicular to the channel region length and substantially locally discontinuous in a direction parallel to the channel region length.

19 Claims, 10 Drawing Sheets

U.S. PATENT DOCUMENTS

| | | | |
|---|---|---|---|
| 7,053,400 B2 * | 5/2006 | Sun et al. | 257/19 |
| 7,141,476 B2 * | 11/2006 | Dao | 438/283 |
| 7,176,520 B2 * | 2/2007 | Miyake et al. | 257/327 |
| 7,279,754 B2 * | 10/2007 | Moniwa et al. | 257/368 |
| 7,371,629 B2 * | 5/2008 | Fu et al. | 438/199 |
| 7,468,303 B2 * | 12/2008 | Sugihara | 438/305 |

* cited by examiner

PMOS TRANSISTOR WITH DISCONTINUOUS CESL AND METHOD OF FABRICATION

This application claims the benefit of U.S. Provisional Application No. 60/655,142, filed on Feb. 22, 2005, entitled "PMOS Transistor with Discontinuous CESL and Method of Fabrication," which application is hereby incorporated herein by reference.

TECHNICAL FIELD

This invention is related generally to semiconductor devices, specifically to devices with stressed contact etch stop layer (CESL). More specifically to PMOS transistors with discontinuous CESL.

BACKGROUND

The scaling of VLSI circuits is a constant effort. With circuits becoming smaller and faster, device driving current improvement becomes more important. Device current is closely related to gate length, gate capacitance, and carrier mobility. Shortening poly-gate length, increasing gate capacitance and increasing carrier mobility can improve the device current performance. Gate length reduction is an ongoing effort in order to shrink circuit size. Increasing gate capacitance has also been achieved by efforts such as reducing gate dielectric thickness, increasing gate dielectric constant, and the like. In order to further improve device current, enhancing carrier mobility has also been explored.

Among efforts made to enhance carrier mobility, forming a strained silicon channel is a known practice. Strain can enhance bulk electron and hole mobility. The performance of a FET device can be enhanced through a strained-surface channel. This technique allows performance to be improved at a constant gate length, without adding complexity to circuit fabrication or design.

When silicon is placed under strain, the in plane, room temperature electron mobility is dramatically increased. One way to develop strain is using graded SiGe epitaxy layer as substrate on which a layer of relaxed SiGe is formed. A layer of silicon is formed on the relaxed SiGe layer. FET devices are then formed on the silicon layer, which has inherent strain. Since the lattice constant of SiGe is larger than that of Si, the Si film is under biaxial tension and thus the carriers exhibit strain-enhanced mobility.

Strain can also be applied to the channel region by forming a strain-inducing contact etch stop layer (CESL) over the FET device. When such a contact etch stop layer is deposited, due to the lattice spacing mismatch between the CESL and the underlying layer, an in-plane stress develops to match the lattice spacing. This in-plane strain also results in a Poisson strain perpendicular to the interface.

Figure 1:
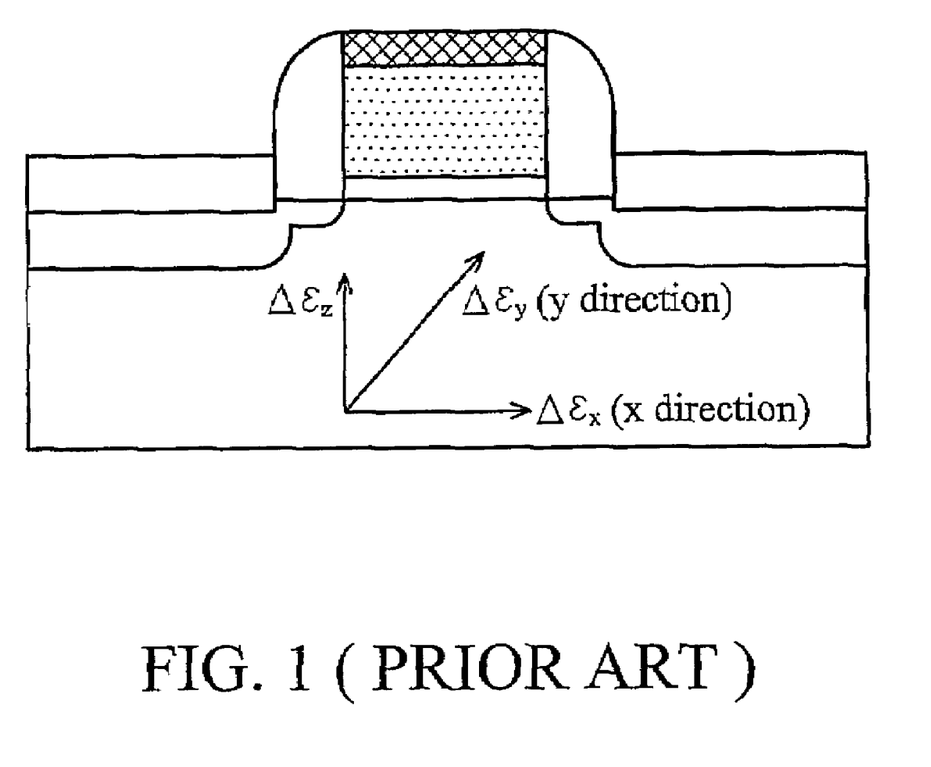
FIG. 1 illustrates the axes of strains for a typical transistor.

As shown in FIG. 1, the stress may have components in three directions: parallel to the FET device channel ($\Delta\in_x$, or referred as x direction), parallel to the device width ($\Delta\in_y$, or referred as y direction), and perpendicular to the channel plane ($\Delta\in_z$, or referred as z direction). The stress in the $\Delta\in_x$ and $\Delta\in_y$ directions is called in-plane stress. Research has revealed that a CESL that induces a bi-axial in-plane tensile strain field (in both the $\Delta\in_x$ and $\Delta\in_y$ direction) can improve NMOS performance. Research has also shown that, for a PMOS device, tensile strain parallel to channel width direction ($\Delta\in_y$) also improves POMS device performance, but tensile strain parallel to the channel length ($\Delta\in_x$) is detrimental to PMOS device performance.

In order to reduce detrimental effects on a PMOS device, the tensile strain in the $\Delta\in_x$ direction should be eliminated or reduced, while strain in the $\Delta\in_y$ direction should be preserved. What is needed in the prior art, then, is a method for improving device performance by promoting desirable strain in a semiconductor layer while minimizing or preventing non-desirable strain, i.e. in a detrimental direction.

SUMMARY OF THE INVENTION

In one aspect, the present invention provides for a PMOS transistor comprising a substrate having a surface, a gate dielectric on said surface of said substrate, and a gate electrode on said gate dielectric. The transistor further comprises a spacer along a sidewall of the gate dielectric and gate electrode. A source and a drain are formed on opposite sides, respectively, of the gate dielectric and gate electrode. The source and drain define a channel region having a channel length extending substantially from the source to the drain, in the substrate there between. The transistor also comprises a contact etch stop layer, said contact etch stop layer being substantially locally continuous in a direction perpendicular to the channel region length and being substantially locally discontinuous in a direction parallel to the channel region length.

In another aspect, the present invention provides for a method of forming a transistor having a strained channel region. The method includes forming a gate dielectric on the surface of a substrate, forming a gate electrode on the gate dielectric, and forming a spacer on a sidewall of the gate electrode. The method further includes forming a source region and a drain region, respectively on opposing sides of the gate electrode, the source and drain region defining a channel region in the substrate, and forming a contact etch stop layer over the spacer, the contact etch stop layer being substantially continuous over the spacer in a direction parallel to the channel width, the contact etch stop layer being substantially discontinuous over the spacer in a direction parallel to the channel length.

In yet another aspect, the invention provides for a method of forming PMOS transistor comprising the steps of forming a gate on a substrate, forming a pair of spacers along opposite sidewalls of said gate, and forming a source and a drain on opposite sides of said gate dielectric and gate electrode. The method further comprises forming silicided regions on said source and said drain, forming a contact etch stop layer covering said gate, said spacers, and said silicide, and forming discontinuities along and adjacent the interface between said spacers and said silicided regions.

To achieve the aforementioned objective, a novel PMOS transistor and methods of making the transistor are described. A gate is formed on the surface of a substrate. A pair of spacers is formed along opposite sidewalls of the gate. A source and a drain are formed on opposite sides of the gate. Silicides are formed on source and drain regions. A strained CESL is formed. Discontinuities are formed in CESL along channel width direction.

DETAILED DESCRIPTION OF ILLUSTRATIVE EMBODIMENTS

Figure 5:
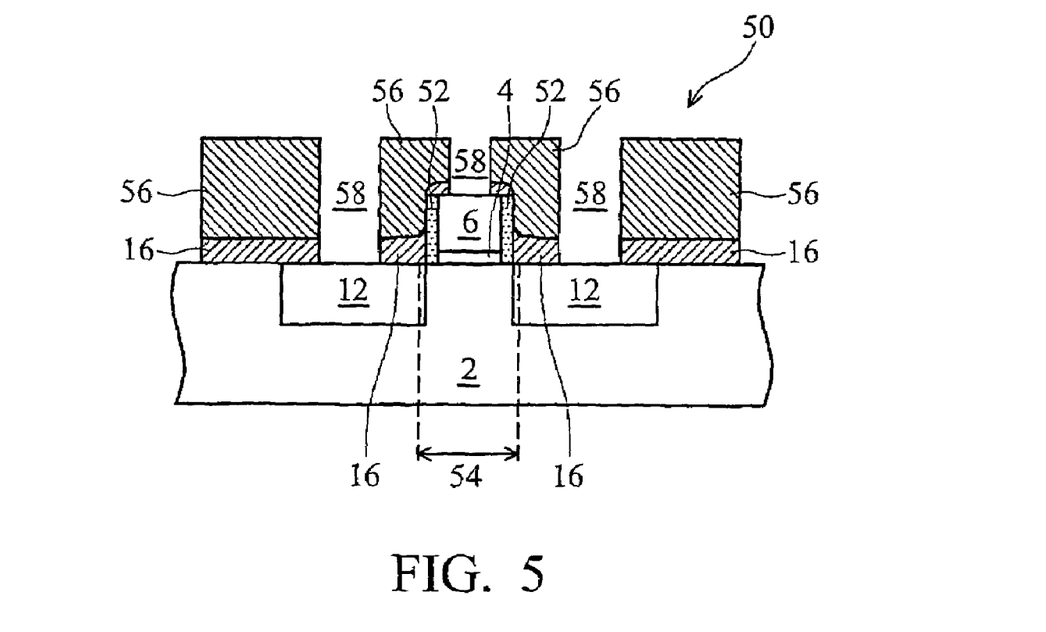
FIG. 5 illustrates a transistor device employing aspects of the present invention.

A novel PMOS transistor, such as illustrated in FIG. 5, and the method of fabrication are described. The transistor 50 has source and drain regions 12 formed within substrate 2 and a gate electrode 6 overlying a gate dielectric 4 overlying the substrate 2. The portion of the substrate 2 underlying the gate electrode 6 and interposed between source and drain regions 12 generally defines a channel region 54. As described above, device performance can be enhanced by application of strain in the appropriate directions and, in the case of a PMOS device, can be hampered by application of strain in undesirable directions. Transistor 50 has a micro-locally discontinuous CESL 16 formed over and electrically insulating source and drain regions 12 and gate electrode 6 (except in contact regions where electrical interconnection is desired). Discontinuities in the CESL 16 are firmed to decouple strain on the PMOS device along the channel width direction ($\Delta \in_y$). Note that the CESL 16 is effectively continuous (at least in the relevant active region) in the $\Delta \in_y$ direction (into the plane of the paper). Because the CESL layer 16 is selected to impose an inherent tensile stress on the underlying silicon regions, desirable stress in the $\Delta \in_y$ direction is achieved. Note further that the local discontinuities 52 decouple or prevent the inherent stress caused by CESL layer 16 from occurring in the undesirable $\Delta \in_y$ in the channel region, indicated generally in FIG. 5 as region 54. The decoupled strain improves mobility of carriers and in turn improves the transistor performance. The terms stress and strain will be used interchangeably and in their broadest sense in the following paragraphs and are intended to broadly cover and describe the concepts of both stress and strain unless the context makes clear that the usage of one term is intended to limit the meaning used in that context. Also shown in FIG. 5 is inter-level dielectric (ILD) layer 56 formed over CESL 16 and contacts 58 which are formed through ILD 56 and CESL 16 to electrically connect gate electrode 6 and source and drain regions 12 to other circuit components, using conventional interconnect technology via subsequently formed metal layers (not shown). Discontinuities are formed between a portion of CESL 16 on top of gate electrode 6 and portions of CESL 16 on top of source and drain regions 12. Further, the discontinuities are between, and do not adjoin, contact opening 58 over gate electrode 6 and contact opening 58 over source and drain regions 12.

Although the illustrative embodiments describe PMOS device fabrication, the concept of decoupling stress in CESL can also be utilized in the fabrication of CMOS and other devices to improve device performance. Additional features and advantages of the invention will be described hereinafter, which form the subject of the claims of the invention. It should be appreciated by those skilled in the art that the conception and specific embodiment disclosed might be readily utilized as a basis for modifying or designing other structures or processes for carrying out the same purposes of the present invention.

Figure 2A:
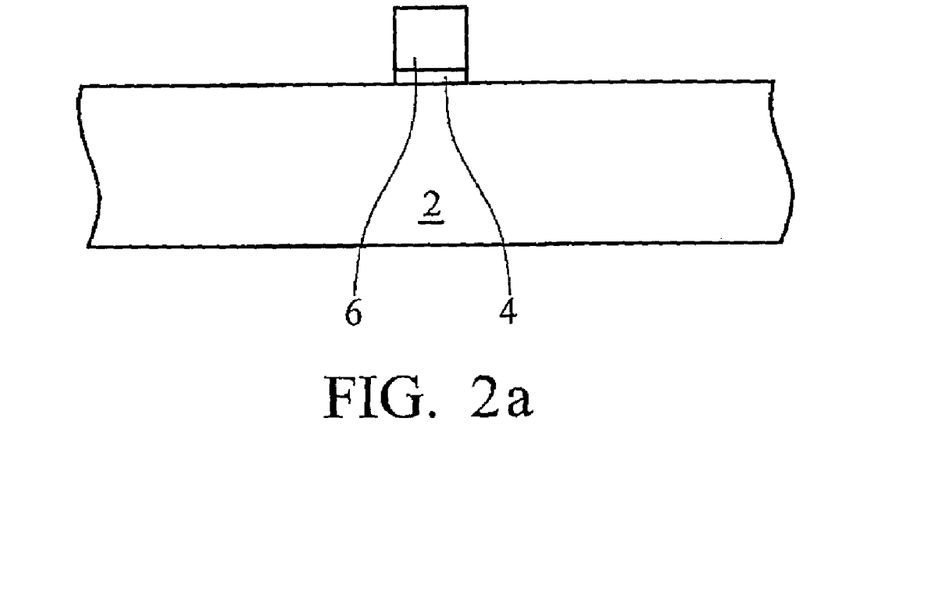
FIGS. 2a through 2g are cross-sectional views of intermediate stages in the manufacture of a PMOS transistor.

FIGS. 2a through 2g illustrate an illustrative embodiment of the present invention. FIG. 2a illustrates the formation of a gate. In the preferred embodiment, the substrate 2 is silicon substrate. In another embodiment, substrate 2 is a virtual substrate: a layer of relaxed SiGe is formed on graded SiGe, and a layer of strained Si is formed on relaxed SiGe. This structure provides a tensile stress to the channel of the device and enhances carrier mobility. In other embodiments, substrate 2 may be formed of bulk semiconductor, strained semiconductor, compound semiconductor, multi-layers of semiconductor, Silicon On Insulator (SOI), Strained Silicon-On-Insulator (SSOI), Strained Silicon Germanium on Insulator (S-SiGeOI), Silicon Germanium On Insulator (SiGeOI), and Germanium On Insulator (GeOI), and the like.

A gate dielectric 4 is deposited on the surface of substrate 2. The gate dielectric may preferably be silicon oxide formed using known methods, such as thermal oxidation, CVD, and the like. The equivalent oxide thickness of the gate dielectric is preferably less than about 22 Å. In other embodiments, the gate dielectric may also be silicon nitride, oxy-nitride, oxygen-containing dielectric, nitrogen-containing dielectric, high-k (k>3.9) materials or any combinations.

FIG. 2a also shows a gate electrode 6 formed on gate dielectric 4. The gate electrode 6 is preferably polysilicon, although it may be formed of metal, or a compound structure comprising metal, semiconductor, metal oxide and/or silicide. Preferably the gate electrode is polysilicon deposited using Chemical Vapor Deposition (CVD). Polysilicon is useful as a mask for self-aligned formation of the source and drain regions, as is known in the art, to minimize gate-to-source/drain overlap. This in turn enhances the device performance. The polysilicon is then doped to reduce sheet resistance. Other embodiments may use amorphous silicon, elemental metals that are conductive, alloys of elemental metals that are conductive, silicides or nitrides of elemental metals that are conductive or any combination of such materials for the gate electrode. The gate polysilicon 6 and gate dielectric 4 are patterned to form a gate.

Figure 2B:
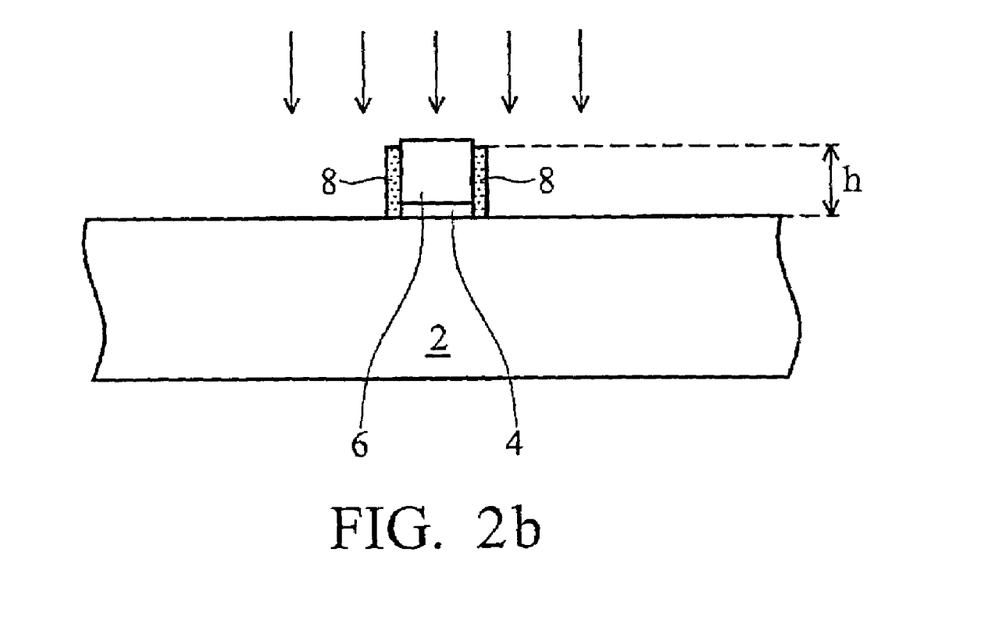

FIG. 2b illustrates a gate with spacers. A pair of spacers 8 is formed along the sidewalls of the gate dielectric 4 and gate electrode 6. Spacers 8 serve as self-aligning masks for a subsequent salicidation process, as described below. In some embodiments described below, the shape of the spacers form a role in forming a discontinuous contact etch stop layer. The spacer material can be oxide, silicon nitride, oxy-nitride or any combinations. The spacers 8 may be formed by well-known methods such as blanket depositing a dielectric layer over substrate 2 and gate electrode 6, then anisotropically etching the dielectric layer to remove the dielectric layer from horizontal surfaces but not from the gate electrode sidewalls. The resulting structures, spacers 8, acts as masks for subsequent steps, as will be described in greater detail below.

Figure 4A:
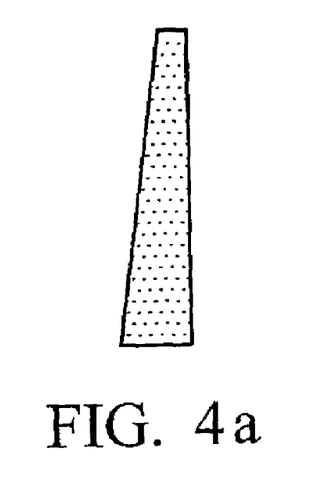
FIGS. 4a and 4b illustrate further detail of spacers used in illustrative embodiments of the present invention.
Figure 4B:
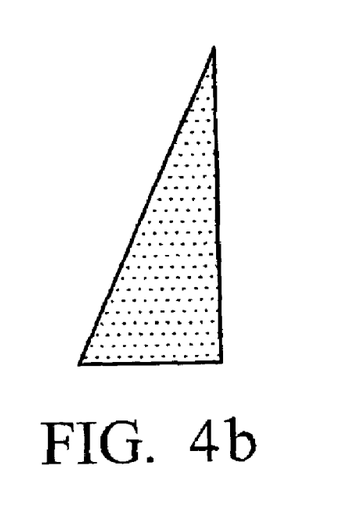

There are two types of spacer profiles as illustrated in FIGS. 4a and 4b. In FIG. 4a, the spacer has a sharp vertical profile, with little so-called footing and little sidewall slope. As a result, the subsequently deposited contact etch stop layer will be deposited having micro-local discontinuities. In FIG. 4b, the spacer has a serious footing profile, with slow sidewall slope. As a result, the subsequently deposited contact etch stop layer will be deposited having continuities. Reactive Ion Etching (RIE) can be used to form a different profile of the spacers. The spacers 8 in FIG. 2b are subjected to an RIE etch process using CF4/O2. During the etch process, the C/F/O is carefully controlled to ensure that spacers 8 have a sharp vertical profile, with little so-called footing and little sidewall slope. If an RIE etch process is used CF2H2/O2 by tuning C/F ratio, we can get the profile illustrated in FIG. 4b. So we can modify spacer profiles to achieve micro-local discontinuities CESL.

As shown in FIG. 2b, after spacers 8 are formed, ions are implanted and relaxed. In one preferred embodiment, source and drain regions are not recessed. Then the source and drain regions are desired to be formed by implanting ions at the same time the spacers 8 are implanted. This step of implanting ions into spacers 8 is to further shape the spacers so that the top portions of the spacers become wider relative to the bottom portions of the spacers, as a result of the swelling of the dielectric material that will result from ion implantation. In order to obtain the desired profile, the implanted ions should lodge primarily in the upper portions of the spacers. In an illustrative embodiment, implantation is conducted in a gas chamber filled with BF2. Ions such as Germanium, Arsenic, Phosphorous, Antimony, Boron, Indium, and the like could be employed to implant the spacers. The IV group elements are generally preferred over the III and IV group elements because less effect occurs on device characteristics. While not necessary for implementation of the present invention, the spacer implantation step can be conducted simultaneously with a standard gate electrode doping step in order to seamlessly integrate the spacer process into a conventional CMOS process flow.

Experiments have revealed that the energy of implantation and type of elements affect the shape of the resulting gate and spacers, hence the sharpness of spacer sidewalls. High implantation energy and heavy elements (such as Germanium or Arsenic) are apt to penetrate into the lower portions of the spacers, and thus cause footing effects and hence sloped spacers. Low implantation energy and light elements (such as Boron) will tend to lodge in the upper portions of the spacers and thus cause top portion expansion and hence sharp spacers. In an illustrative embodiment, germanium is implanted at an implant energy in the range of about 5 keV to about 30 keV, and preferably about 10 keV. By contrast, if the implant energy is higher than about 30 keV, the germanium ions will tend to penetrate into the lower portions of the spacers and will tend to flatten the spacer sidewall profiles. Besides, the implanted ion concentrations have no obvious effect on spacer profiles.

Figure 2C:
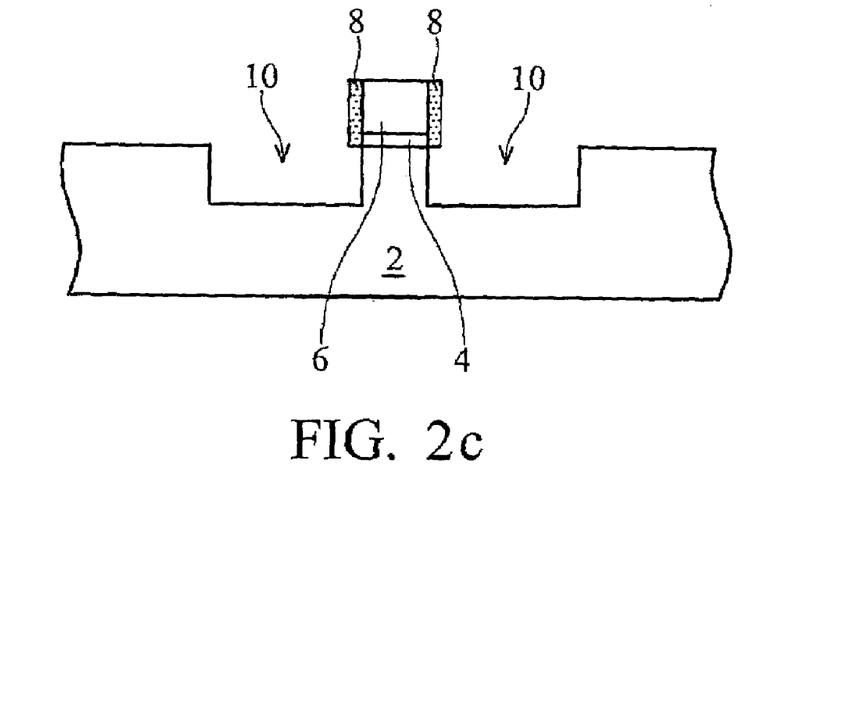
Figure 6:
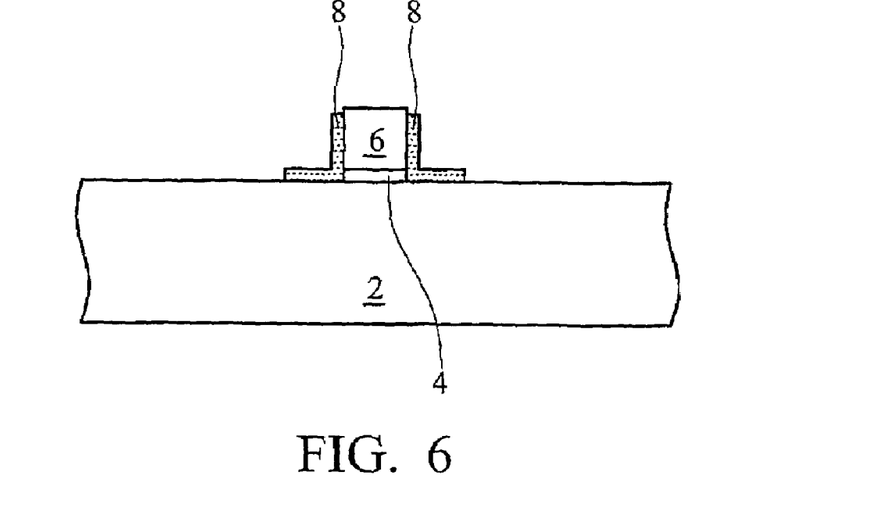
FIG. 6 illustrates L-shaped spacers that may be employed in illustrative embodiments of the present invention.

Turning back now to the transistor manufacturing process, as shown in FIG. 2c, a pair of recesses 10 is formed adjacent to spacers 8 on either side of gate electrode 6 by etching into substrate 2. In the preferred embodiment, substrate 2 is undercut beneath spacers 8, resulting in the recesses being aligned with gate electrode 6. Spacers 8 are designed so as to allow for precise alignment of the recesses with the gate electrodes. In other embodiments, spacers 8 may be designed so that the recessed regions are spaced apart (in the vertical alignment sense) from the gate electrode 6. In yet other embodiments, it may be desirable to have recesses formed within the vertical boundaries of gate electrode 6, such that the channel region resulting from the subsequently formed source and drain regions is shorter than the gate electrode width. One skilled in the art will recognize that the optimum alignment of the recesses can be derived through routine experimentation. Recesses 10 may be formed by anisotropically etching the substrate using, e.g. ion etching. Anisotropic etching causes the recesses formed in the region not protected by spacers. But it has to be realized that there is typically lateral etching causing the recesses to extend below spacers. The width of the spacer forms a region that allows some room for lateral etching. In some embodiments, an L-shaped spacer may be employed, such as shown in FIG. 6. An L-shaped spacer has an extension that can be adjusted for precise alignment.

Figure 2D:
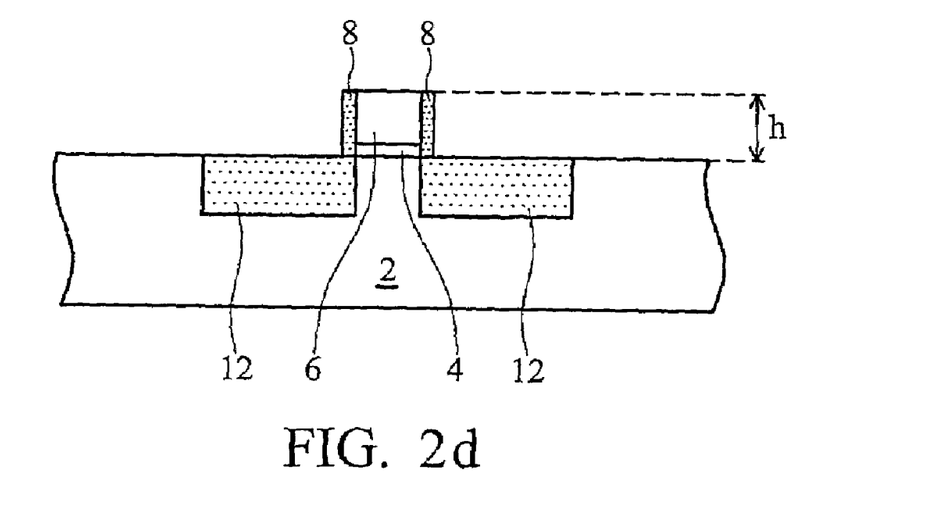

After formation of spacers 8, processing continues to form source and drain regions. In the below described illustrative embodiments, source and drain regions are formed in recesses formed in the underlying substrate 2. Alternatively, source and drain regions can be formed using conventional ion implantation into selected regions of the substrate, as is known in the art. FIG. 2d illustrates that the source and drain 12 are grown in recesses 10. The material of source and drain 12 is semiconductor, preferably SiGe, and desired p type impurities may be doped while the growth proceeds. Preferably selective epitaxial growth (SEG) is employed for grow the source and drain regions, although other known methods can also be used.

FIG. 2d also illustrates the height h between the top of gate electrode 6 and source and drain regions 12. As will become apparent below, the height h is yet another parameter that can affect the formation of a discontinuity in the subsequently formed CESL. If a continuous CESL is desired to be formed on sidewall of spacers, the height h should be comparable to the thickness of CESL. If the height h is significantly larger than the CESL thickness, this will detrimentally affect the formation of a continuous CESL layer on the spacer sidewalls and thus assist in the formation of a local discontinuity in the CESL. One skilled in the art will recognize that the recessed source and drain regions can be formed recessed relative to the substrate 2 surface, thus increasing the height h of the spacer sidewall. In other embodiments, the source and drain regions can be above the substrate surface.

Figure 2E:
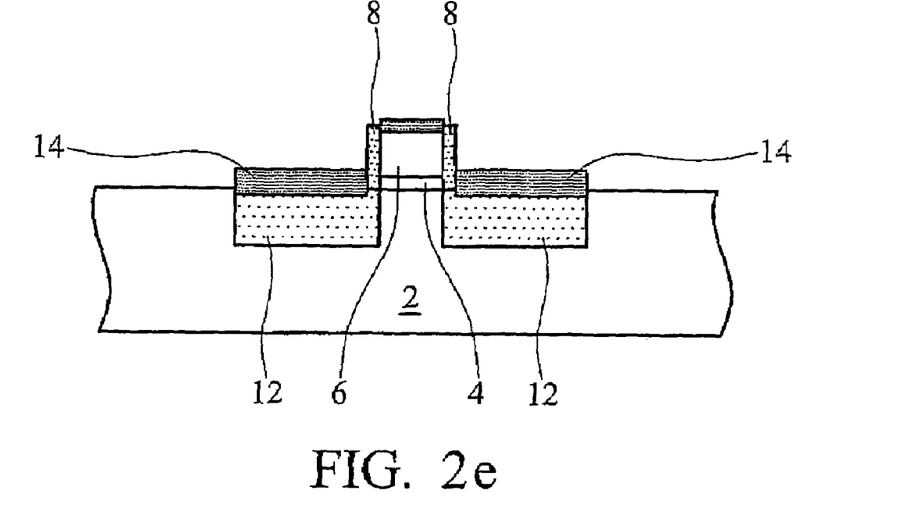

As shown in FIG. 2e, silicide regions 14 are formed through a Self-Aligned Silicide (salicide) process. The gate electrode and source and drain regions are coated with a transitional metal, such as Cobalt, Titanium, Nickel, or the like. The device is then heated, which causes the metal to react with the underlying silicon and form a silicide. The un-reacted metal is selectively removed through the use of an etchant that does not attack the silicide, $SiO_2$ and silicon substrate, as is well known in the art.

Figure 2F:
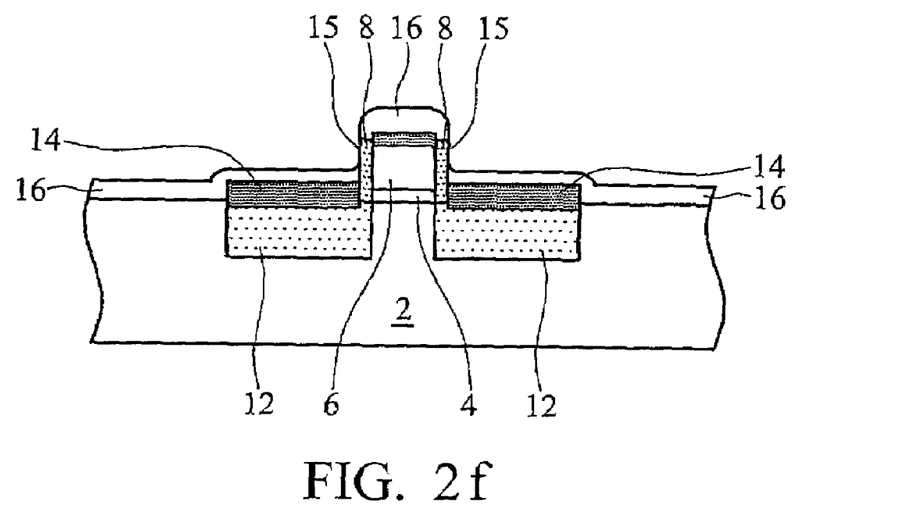

As shown in FIG. 2f, a contact etch stop layer (CESL) 16 is blanket deposited covering whole device including source, drain and gate. As discussed above, this layer serves two purposes. First, it provides a tensile stress to the underlying device channel region and enhances carrier mobility. Second, it acts as an etch stop layer to protect underlying regions from being etched during the subsequent process step to form electrical contacts to the source and drain regions and/or gate electrode. The etch stop layer needs to have sufficient thickness to provide the desired stress. In an illustrative embodiment, CESL 16 is formed by depositing a silicon nitride layer to a thickness of about 20 nm to about 100 nm, preferably about 70 nm. The silicon nitride layer is preferably deposited using a low-pressure CVD process, although plasma enhanced CVD could be employed to deposit the nitride CESL layer. In other embodiments, oxynitride, aluminum oxide, aluminum nitride, titanium oxide, silicon carbide, and aluminum silicate could be used for the CESL. The CESL 16 has inherent tensile stress of up to about 1.7 Giga Pa, preferably 1.3 Giga Pa, which stress strains the underlying silicon regions over which the CESL is formed.

Also shown in FIG. 2f, discontinuities 15 are formed on the sidewall of spacers 8 as CESL 16 is deposited. As discussed above, these discontinuities result from the sidewall profile of the spacers as well as the height h of the sidewalls (FIG. 2d) relative to the thickness of the CESL layer. CESL 16 deposition mainly occurs on horizontal surfaces, and deposition on vertical surfaces is minimized. Normally, a definite discontinuity 15 appears on the spacer sidewall after deposition of CESL. Occasionally, some CESL material is formed on sidewall, but it is much thinner than the CESL layer on source/drain and gate regions and the thickness is not enough to bridge the stress between the CESL on the gate region and the CESL on the source/drain regions. In other words, even assuming some CESL layer material is formed along the sidewalls, it will be very thin along the sidewalls and hence the strain imposed in the $\Delta \in_x$ is reduced or eliminated, even with a thin CESL layer over the sidewalls. Therefore, the CESL 16 is effectively discontinuous (in the sense of imposing a tensile or compressive strain) along the $\Delta\in_y$ direction.

Figure 2G:
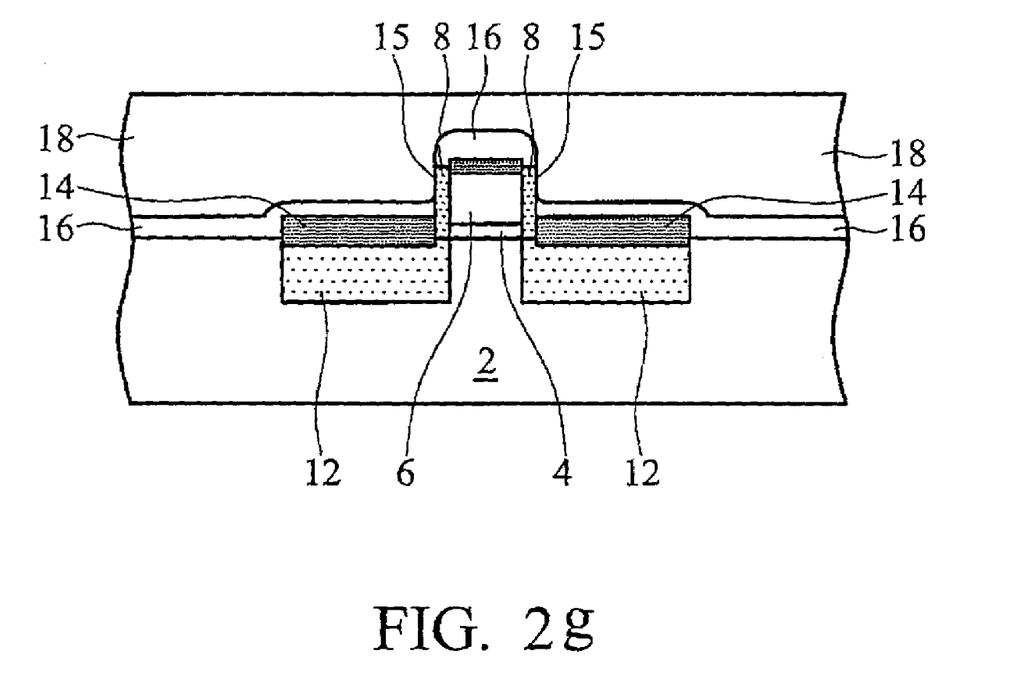

Next, as shown in FIG. 2g, an inter-level dielectric (ILD) 18, also sometimes known as a pre-metal dielectric (PMD) or an inter-metal dielectric (IMD) layer is deposited over the surface of CESL 16. This ILD layer 18 is preferably silicon dioxide deposited using, e.g., Tetraethyl Orthosilicate (TEOS), CVD, PECVD, LPCVD, or other well-known deposition techniques. ILD layer 18 will provide insulation between the transistor and overlying metal lines that will be formed subsequently. The stress in ILD layer 18 is much lower than in CESL 16 and hence the fact that the ILD layer 218 is effectively continuous in both the $\Delta\in_x$ and $\Delta\in_y$ directions does not affect the amount or direction of strain on the underlying regions. A photo resist material (not shown) will be formed and patterned over the ILD layer 18 in order to form contact openings to the source and drain regions and the gate.

Figure 3A:
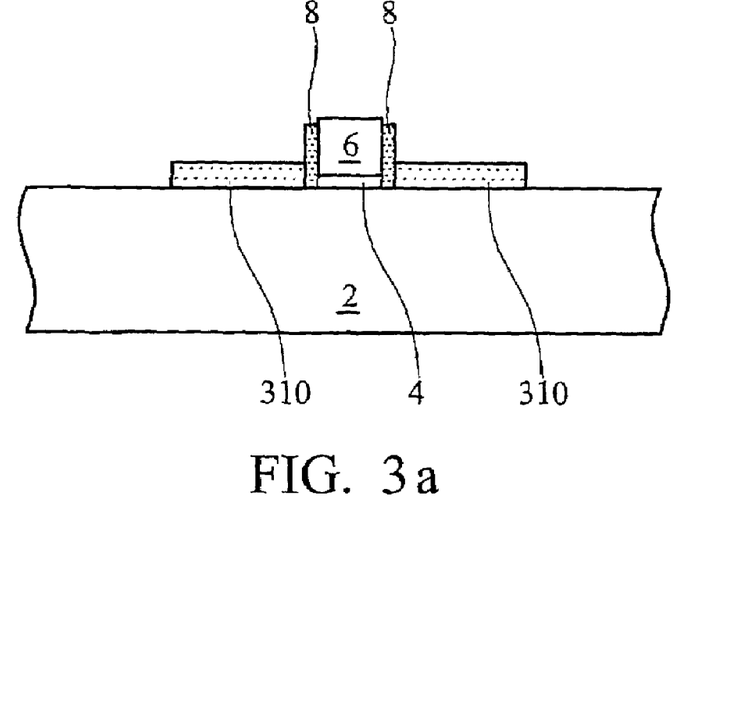
FIGS. 3a through 3f illustrate cross-sectional views of intermediate stages of another embodiment.

FIGS. 3a through 3f illustrate another embodiment of the present invention. The formation of gate dielectric 4 and gate electrode 6 has already been described above with reference to FIGS. 2a and 2b and need not be repeated with regard to the presently described embodiment. A pair of spacers 8 is then formed along the sidewalls of the gate dielectric 4 and gate electrode 6. As described in previous embodiments, spacers 8 are formed by blanket depositing a dielectric layer over the entire region, then anisotropically etching the layer to remove dielectric material from the horizontal surfaces and leaving resulting spacers along the gate electrode sidewalls. In this embodiment, there is no requirement that the spacer sidewalls have a sharp, or vertical profile, or that the upper portion of the spacers are thicker than the lower portions. FIG. 3a illustrates rectangle spacers. In another embodiment, the spacers 8 can also be L-shaped, the formation of which is known in the art. The length of the horizontal legs of L-shaped spacers is preferably less than about 650 nm.

FIG. 3a also illustrates the formation of raised source and drain regions 310. A semiconductor material that defines the regions of source and drain is epitaxially deposited. A preferred method of forming the semiconductor material is selective epitaxial growth, although other methods will be apparent to one of ordinary skill in the art with the benefit of the present teachings and routine experimentation. In the illustrated embodiment, a mask layer (preferably $SiO_2$) layer (not shown) is formed to cover substrate 2 and openings are then formed through the mask layer to expose the source/drain regions. Semiconductor material is then epitaxially grown in the exposed regions, preferably using Molecular Beam Epitaxy (MBE), although other deposition techniques, including Chemical Vapor Deposition (CVD), Ultra High Vacuum Chemical Vapor Deposition (UHVCVD), Atomic Layer chemical Vapor Deposition (ALCVD) or Metal Organic Chemical Vapor Deposition (MOCVD) can also be used. In the region where the underlying single crystal substrate 2 is exposed, the semiconductor material grows epitaxially, resulting in the single crystal source and drain regions 310 illustrated in FIG. 3a. On the $SiO_2$ mask layer, polycrystalline or amorphous semiconductor material is formed. The polycrystalline or amorphous and $SiO_2$ mask layer are then removed, preferably using an etching process that is highly selective between epitaxial semiconductor material on the one hand, and polycrystalline or amorphous semiconductor material and the mask layer material (such as $SiO_2$) on the other hand. The semiconductor material could optionally comprise silicon, germanium, carbon, and alloys of silicon, germanium, carbon and other semiconductors.

The source and drain regions 310 are then exposed to ion-implantation. It is desirable that the source and drain regions be doped with p type dopant to form an illustrative PMOS transistor. The resistivity of the polysilicon is reduced through doping. An annealing step is then performed to restore the lattice structure to its pre-implanted state. The annealing process is carefully controlled. In one embodiment, the dopant is diffused vertically beyond the implant-damaged region. In another embodiment, a Rapid Thermal Process (RTP) also known as a Rapid Thermal Anneal (RTA) is adopted to minimize dopant redistribution. Lateral distribution may cause dopant to diffuse into the substrate region under spacers and in some instances some dopant may diffuse under the gate region as well, further reducing the effective channel length of the resulting transistor. One skilled in the art will be well-versed in the control of processes and parameters in order to obtain a desired dopant profile.

Figure 3B:
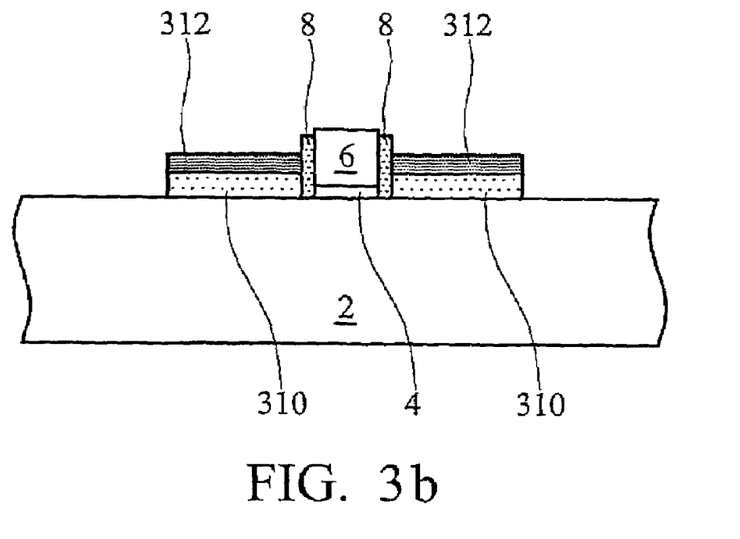

Next, as shown in FIG. 3b, the raised source and drain regions are silicided. The gate electrode is preferably also silicided at this time. As discussed above, silicides of Nickel, Titanium, Cobalt, or other such metals can be employed.

Figure 3C:
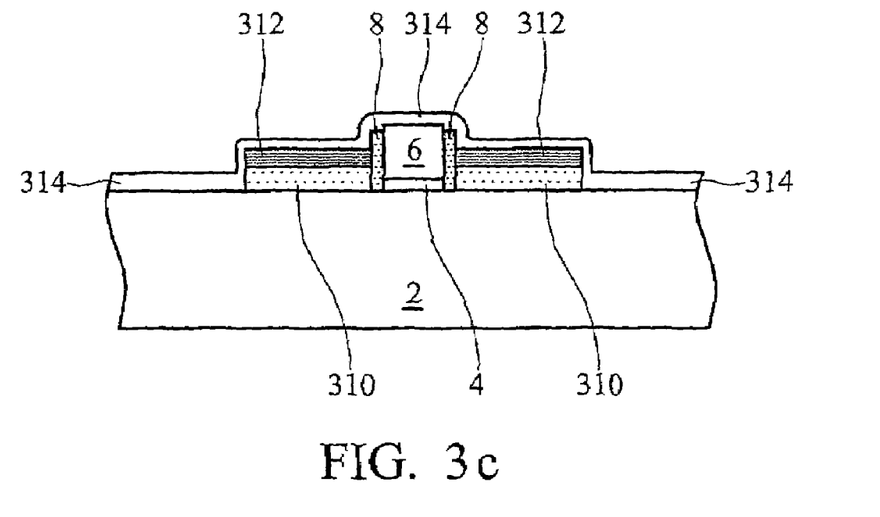

As shown in FIG. 3c, a CESL 314 is formed to cover the entire device formed during the previous steps. CESL layer 314 may be the same material deposited in the same manner as CESL 16 described above with reference to FIG. 2f. In this embodiment, however, CESL 314 is deposited as a continuous layer along not only the upper surfaces of spacers 8 and source and drain regions 310 and gate electrode 6, but also along the sidewalls of spacers 8. As such, the relationship between CESL 314 thickness and spacer height h is not as important in this embodiment. Likewise, because the formation of CESL 314 on the spacer sidewalls is not undesirable, other deposition techniques could be employed to form CESL 314. Despite these difference, CESL 314 should be deposited using a material and in a manner to cause an inherent strain on the underlying semiconductor material, particularly the channel region, as has been described above. In this embodiment, the CESL 314 is preferably formed of silicon nitride using low pressure CVD. CESL 314 is preferably formed to a thickness of from about 20 nm to about 100 nm.

Figure 3D:
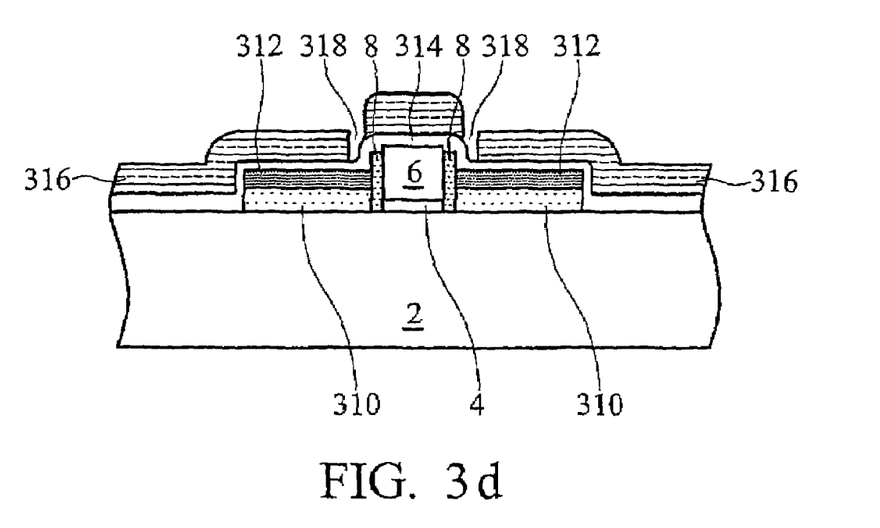

As illustrated in FIG. 3d, a photo resist 316 is applied on CESL 314. Openings 318 are formed on photo resist 316 substantially aligned with the interface where spacers 8 abut the source and drain regions 310 (along $\Delta\in_y$ direction). Openings 318 are formed in the photoresist layer 316 to expose portions of CESL 314. The preferred width of openings 318 is in the range of about 10 nm to about 50 nm, and more preferably about 30 nm in width. The exposed portions of CESL 314 is then subject to an etch treatment. Preferably CESL 314 is etched by $CF_4/O_2$.

Figure 3E:
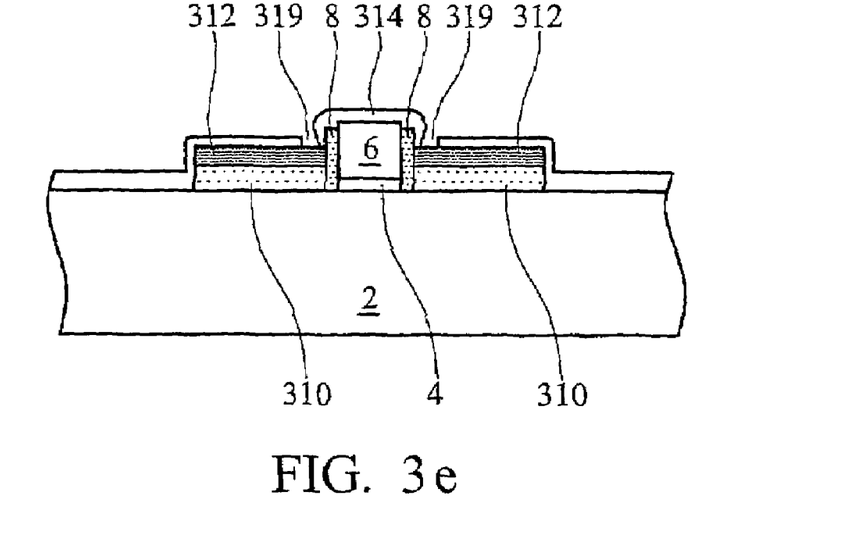

FIG. 3e shows the cross-sectional view of the PMOS transistor after etching. CESL 314 is etched anisotropically through openings 318 in the photoresist layer 316, resulting in corresponding openings 319 in the CESL. These openings 319 break the CESL layer in the $\Delta\in_y$ direction, thus reducing or eliminating strain in the $\Delta\in_y$ direction on the underlying channel region. Desirable strain in the $\Delta\in_x$ direction remains unabated, however.

Figure 3F:
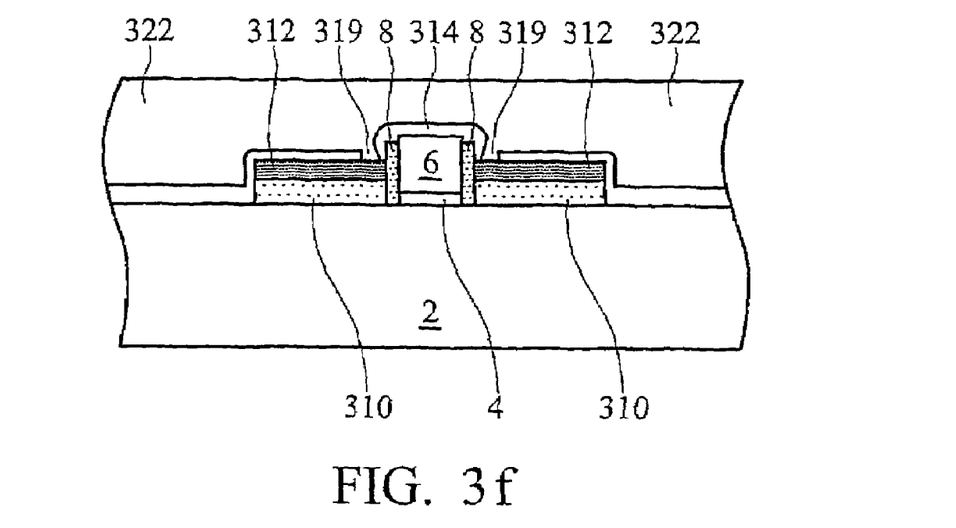

As illustrated in FIG. 3f, photo resist 316 is removed and an inter-level dielectric 322 is then formed. Electrical contacts (not shown) to the source/drain regions and gate electrode are then formed as is well known in the art.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A transistor comprising:
    a substrate having a surface;
    a gate dielectric on said surface of said substrate;
    a gate electrode on said gate dielectric;
    a spacer along a sidewall of said gate dielectric and gate electrode;
    a source and a drain formed on opposite sides, respectively, of said gate dielectric and said gate electrode, the source and drain defining a channel region having a channel length extending substantially from said source to said drain, in the substrate therebetween;
    a contact etch stop layer on said gate electrode and said spacers, and said source and drain, wherein said contact etch stop layer comprises a discontinuity extending in a channel width direction;
    an inter-level dielectric over said contact etch stop layer;
    a first contact opening over said gate electrode;
    a second contact opening over one of said source and said drain, wherein said discontinuity is between said first and second contact openings, and wherein the discontinuity does not adjoin the first and the second contact openings.

2. The transistor of claim 1 further comprising a source silicide region between and abutting the source and the contact etch stop layer, and a drain silicide region between and abutting the drain and the contact etch stop layer.

3. The transistor of claim 1 wherein said contact etch stop layer is formed of a dielectric material selected from the group consisting essentially of silicon nitride, oxy-nitride, aluminum oxide, aluminum nitride, titanium oxide, silicon carbide, aluminum silicate, and combinations thereof.

4. The transistor of claim 1 wherein said first and said second contact openings penetrate through the contact etch stop layer.

5. The transistor of claim 1 wherein said gate dielectric has an effective oxide thickness of less than about 17 Å.

6. The transistor of claim 1 wherein said gate electrode comprises a material selected from the group consisting essentially of polysilicon, amorphous silicon, doped polysilicon, doped amorphous silicon, conductive elemental metals, alloys of conductive elemental metals, silicides or nitrides of conductive elemental metals, and combinations thereof.

7. The transistor of claim 1 wherein said spacer is L shaped.

8. The transistor of claim 7 wherein said L shaped spacer has a horizontal leg with a length of less than about 650 nm.

9. The transistor of claim 1 wherein said source and drain are raised above the surface of said substrate.

10. The transistor of claim 1 wherein said source and drain are recessed below the surface of said substrate.

11. The transistor of claim 1, wherein said discontinuity is a portion of said contact etch stop layer having a thickness substantially less than a thickness of a remainder of said contact etch stop layer.

12. The transistor of claim 1, wherein said contact etch stop layer comprises a first portion on top of at least one of said gate electrode and said spacer, and a second portion on one of said source and said drain, and wherein said discontinuity is an opening separating said first and second portions of said contact etch stop layer, wherein said opening is adjacent to an interface between said spacer and a source/drain silicide region.

13. The transistor of claim 1, wherein said source and said drain are of p-type.

14. The transistor of claim 1, wherein said contact etch stop layer has a non-flat top surface, and said inter-level dielectric has a substantially flat top surface.

15. A transistor comprising:
    a substrate having a top surface;
    a gate dielectric on said top surface of said substrate;
    a gate electrode on said gate dielectric;
    a gate spacer on a sidewall of said gate dielectric and said gate electrode;
    a source/drain region adjacent said gate spacer;
    a contact etch stop layer comprising a first portion extending from over said gate electrode to over said spacer, and a second portion over said source/drain region;
    an opening in said contact etch stop layer separating said first and second portions, wherein said opening is parallel to a channel width direction; and
    an inter-level dielectric (ILD) over said contact etch stop layer;
    a first and a second contact opening in said ILD and not adjoining the opening, wherein said first contact opening is over said gate electrode, and wherein said second contact opening is over said source/drain region, and wherein said opening of said contact etch stop layer is between said first and said second contact openings, and close to a sidewall of said gate spacer.

16. The transistor of claim 15, wherein said opening is on a sidewall of said gate spacer.

17. The transistor of claim 15, wherein said opening is substantially over said source/drain region.

18. The transistor of claim 15 further comprising a source/drain silicide region between and abutting the source/drain region and the contact etch stop layer.

19. The transistor of claim 15, wherein said first and said second contact openings penetrate through the contact etch stop layer.

* * * * *